(12) United States Patent
Yang et al.

(10) Patent No.: US 10,651,183 B1
(45) Date of Patent: May 12, 2020

(54) MANUFACTURING METHOD OF SEMICONDUCTOR DEVICE

(71) Applicant: United Microelectronics Corp., Hsinchu (TW)

(72) Inventors: Jianjun Yang, Singapore (SG); Cheng-Hua Yang, Hsinchu (TW); Fan-Chi Meng, Hsinchu (TW); Chih-Chien Chang, Hsinchu (TW); Shen-De Wang, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 16/221,382

(22) Filed: Dec. 14, 2018

(51) Int. Cl.
*H01L 21/336* (2006.01)
*H01L 27/11517* (2017.01)

(52) U.S. Cl.
CPC .............................. *H01L 27/11517* (2013.01)

(58) Field of Classification Search
CPC ............. H01L 21/28035; H01L 27/105; H01L 27/11517; H01L 27/11526; H01L 27/11539; H01L 29/42328; H01L 29/66825
USPC ............................ 438/257–267; 257/314–320
See application file for complete search history.

(56) References Cited

U.S. PATENT DOCUMENTS

| | | | |
|---|---|---|---|
| 6,998,304 B2 | 2/2006 | Wu et al. | |
| 2003/0127684 A1* | 7/2003 | Yoo ..................... | G11C 16/0433 257/316 |
| 2005/0281125 A1* | 12/2005 | Chung ............... | G11C 16/0425 365/232 |
| 2008/0050875 A1* | 2/2008 | Moon ................... | H01L 27/105 438/257 |

* cited by examiner

*Primary Examiner* — Brook Kebede
(74) *Attorney, Agent, or Firm* — J.C. Patents

(57) ABSTRACT

A manufacturing method of a semiconductor device includes: providing a substrate having memory and high voltage regions; sequentially forming a floating gate layer and a hard mask layer on the substrate; patterning the hard mask layer to form a first opening exposing a portion of the floating gate layer in the range of the memory region; patterning the hard mask layer and the floating gate layer to form a second opening overlapped with the high voltage region; performing a first thermal growth process to simultaneously form a first oxide structure on the portion of the floating gate layer exposed by the first opening, and to form a second oxide structure on a portion of the substrate overlapped with the second opening; removing the hard mask layer; and patterning the floating gate layer by using the first oxide structure as a mask.

16 Claims, 12 Drawing Sheets

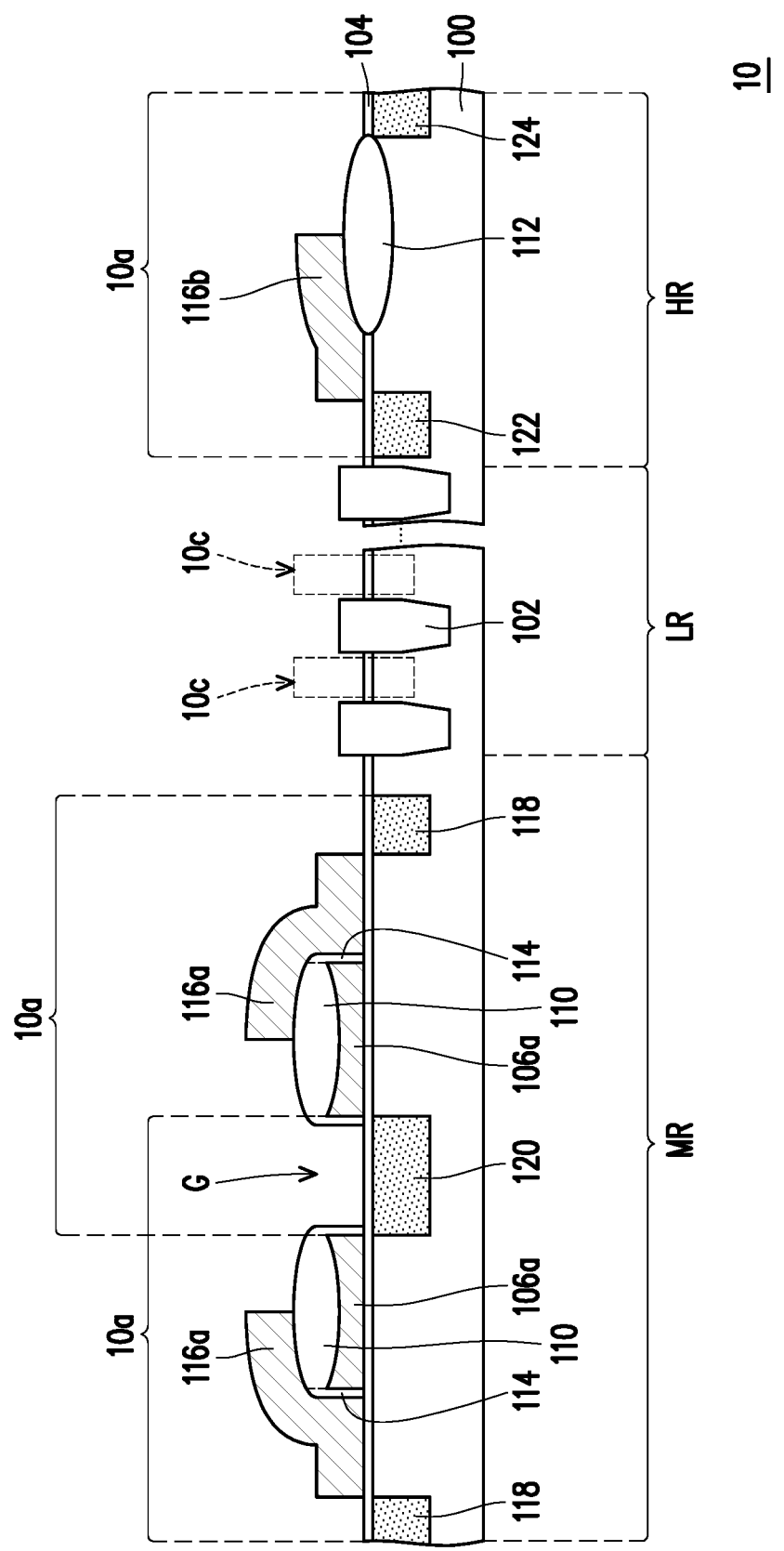

MANUFACTURING METHOD OF SEMICONDUCTOR DEVICE

BACKGROUND OF THE INVENTION

1. Field of the Invention

The present invention generally relates to a manufacturing method of a semiconductor device, and particularly, to a method for integrally manufacturing a split gate flash memory device with a high voltage transistor.

2. Description of Related Art

Integrating multiple transistor structures on a single die helps to reduce the number of chip components in a semiconductor package. Fewer chip components in the semiconductor package indicates that an area required on the board is reduced. However, in current methods for integrally manufacturing a flash memory with a high voltage transistor, an oxide structure used for the high voltage transistor often subjects to damages during the subsequent formation of the flash memory device.

SUMMARY OF THE INVENTION

Accordingly, the present invention is directed to a manufacturing method of a semiconductor device, of which a flash memory device is integrated with a high voltage transistor, and damage on the oxide structure of the high voltage transistor is effectively reduced.

A manufacturing method of a semiconductor device of some embodiments in the present invention includes: providing a substrate having a memory region and a high voltage region; sequentially forming a floating gate layer and a hard mask layer on the substrate, wherein the floating gate layer and the hard mask layer span in the ranges of the memory region and the high voltage region; patterning the hard mask layer to form a first opening exposing a portion of the floating gate layer located in the range of the memory region; patterning the hard mask layer and the floating gate layer to form a second opening overlapped with the high voltage region; performing a first thermal growth process to simultaneously form a first oxide structure on the portion of the floating gate layer exposed by the first opening, and to form a second oxide structure on a portion of the substrate overlapped with the second opening; removing the hard mask layer; and patterning the floating gate layer by using the first oxide structure as a mask, to form a floating gate structure in the range of the memory region.

In some embodiments, the step of forming the second opening includes: removing a portion of the hard mask layer that is overlapped with the high voltage region of the substrate; and removing a portion of the floating gate layer to form the second opening by using the patterned hard mask layer as a mask.

In some embodiments, the step of forming the first opening and the step of removing the portion of the hard mask layer that is overlapped with the high voltage region of the substrate are performed at the same time.

In some embodiments, a temperature of the first thermal process ranges from 900° C. to 1000° C.

In some embodiments, the manufacturing method of the semiconductor device further includes: forming a dielectric layer on the substrate before forming the floating gate layer and the hard mask layer.

In some embodiments, the floating gate structure is located on the dielectric layer.

In some embodiments, the manufacturing method of the semiconductor device further includes: forming an inter-gate dielectric layer on a sidewall of the floating gate structure; and forming a control gate structure over the substrate within the range of the memory region to cover a surface of the inter-gate dielectric layer, wherein the control gate structure further extends onto the first oxide structure.

In some embodiments, the inter-gate dielectric layer is formed by a second thermal growth process.

In some embodiments, a temperature of the second thermal growth process ranges from 900° C. to 1000° C.

In some embodiments, the manufacturing method of the semiconductor device further includes: forming a first doped region and a second doped region in the memory region of the substrate, wherein the control gate structure, the first oxide structure, the inter-gate dielectric layer and the floating gate structure are located between the first doped region and the second doped region.

In some embodiments, the manufacturing method of the semiconductor device further includes: forming a gate structure over the substrate within the range of the high voltage region, wherein the gate structure extends onto the second oxide structure.

In some embodiments, the manufacturing method of the semiconductor device further includes: forming a third doped region and a fourth doped region in the high voltage region of the substrate, wherein the gate structure and the second oxide structure are located between the third doped region and the fourth doped region.

In some embodiments, a thickness of a central region of the first oxide structure is greater than a thickness of a peripheral region of the first oxide structure, and a thickness of a central region of the second oxide structure is greater than a thickness of a peripheral region of the second oxide structure.

In some embodiments, a thickness of a central region of the floating gate structure is less than a thickness of a peripheral region of the floating gate structure.

In some embodiments, the substrate further has a logic region, and the logic region is located between the memory region and the high voltage region.

In some embodiments, a plurality of isolation structures and at least one logic device are formed in and over the substrate within the range of the logic region, and the at least one logic device is located between adjacent isolation structures.

As above, the flash memory devices, the high voltage transistor and the logic devices are integrally formed in the semiconductor device. As compared to a conventional manufacturing method that forms oxide structures for different applications at different stages, the first oxide structures for the flash memory devices and the second oxide structure for the high voltage transistor are simultaneously formed in the manufacturing process of the semiconductor device in the present invention. As such, the manufacturing method is simplified, and the manufacturing cost is lowered. Furthermore, during the conventional manufacturing method, a pad oxide layer is typically formed prior to the formation of the oxide structures, and this pad oxide layer is required to be removed after some of the oxide structures are formed. As a result, the formed oxide structures may subject to damages during the removal of the pad oxide layer. On the other hand, according to the embodiments of the present invention, the initially formed dielectric layer is remained in the final structure of the semiconductor device as a tunnel oxide layer of the flash memory device and a gate dielectric layer of the high voltage transistor. Formation and removal of a pad oxide layer are absent in the manufacturing method of the semiconductor device in the present application. Accordingly, damages on the oxide structures (e.g., the first oxide structures and the second oxide structure) can be effectively reduced. Therefore, reliability of the semiconductor device is improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A through FIG. 2K are schematic cross-sectional view of structures at various stages of the manufacturing method of the semiconductor device shown in FIG. 1.

DESCRIPTION OF THE EMBODIMENTS

Figure 1:
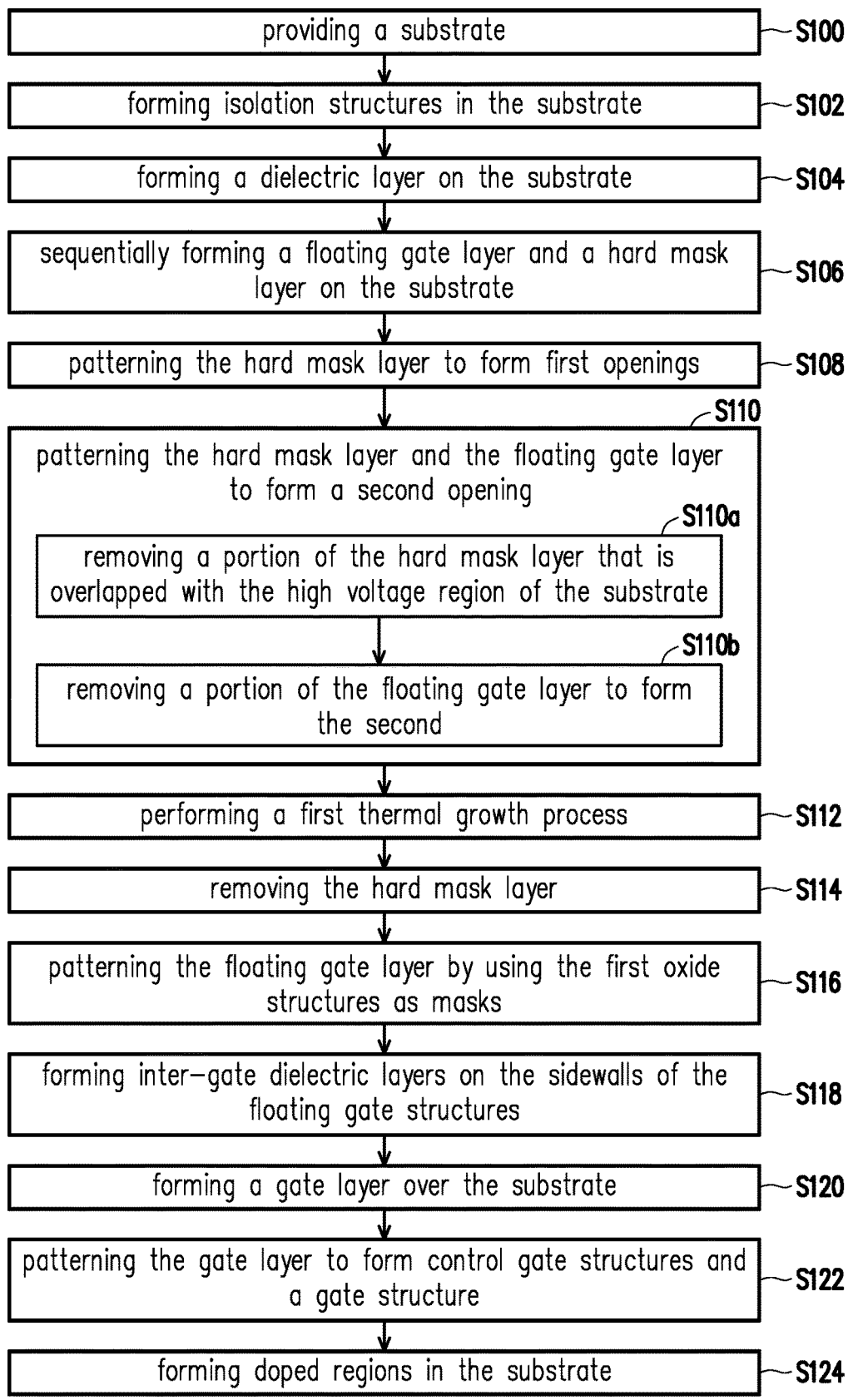
FIG. 1 is a process flow diagram illustrating a manufacturing method of a semiconductor device according to some embodiments of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a process flow diagram illustrating a manufacturing method of a semiconductor device according to some embodiments of the present invention. FIG. 2A through FIG. 2K are schematic cross-sectional view of structures at various stages of the manufacturing method of the semiconductor device shown in FIG. 1.

Figure 2A:
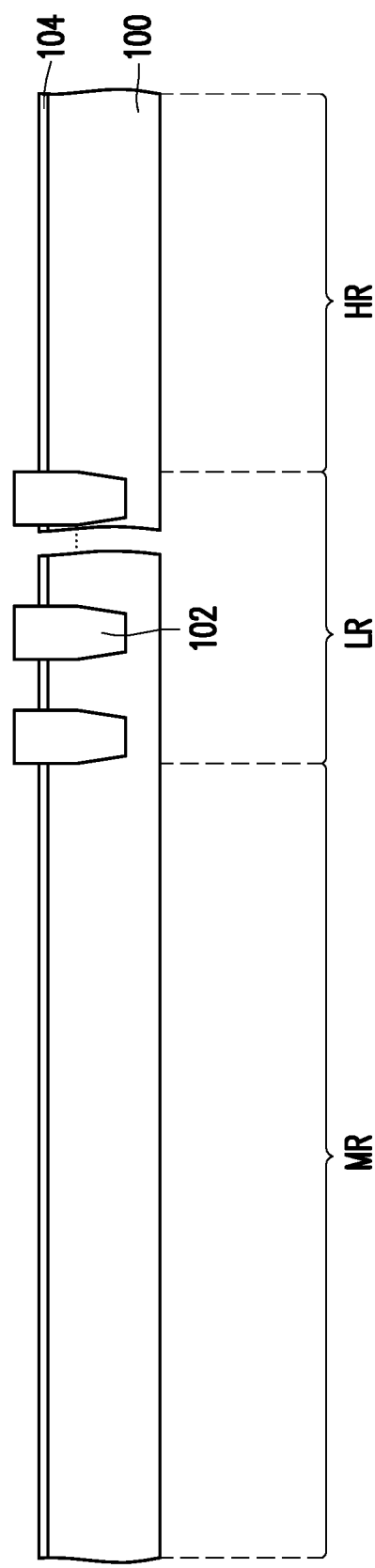

Referring to FIG. 1 and FIG. 1A, step S100 is performed, and a substrate 100 is provided. In some embodiments, the substrate 100 has a memory region MR and a high voltage region HR. In the following steps, memory device(s) (e.g., the flash memory devices 10a shown in FIG. 2K) may be formed in and over the memory region MR, and high voltage transistor(s) (e.g., the high voltage transistor 10b shown in FIG. 2K) may be formed in and over the high voltage region HR. In some embodiments, the substrate 100 further has a logic region LR. In these embodiments, logic element(s) (e.g., the logic device 10c shown in FIG. 2K) may be formed in and over the logic region LR in the following steps. Although the logic region LR shown in FIG. 2A is located between the memory region MR and the high voltage region HR, those skilled in the art may modify the configurations of the memory region MR, the logic region LR and the high voltage region HR, the present invention is not limited thereto.

In some embodiments, the substrate 100 may be a semiconductor wafer or a semiconductor-on-insulator (SOI) wafer. The semiconductor material of the semiconductor wafer or the SOI wafer may include an elemental semiconductor material, a semiconductor alloy or a semiconductor compound. For instance, the elemental semiconductor may include Si or Ge. The semiconductor alloy may include SiGe, SiGeC or the like. The semiconductor compound may include SiC, a III-V semiconductor or a II-VI semiconductor.

Step S102 is performed, and a plurality of isolation structures 102 are formed in the substrate 100. The isolation structures 102 are formed within the logic region LR. Those skilled in the art may adjust the spacing and the amount of the isolation structures 102, the present invention is not limited thereto. In some embodiments, additional isolation structure(s) (not shown) may be further formed in the memory region MR and the high voltage region HR. The isolation structures (e.g., the isolation structures 102 and the additional isolation structures) may be shallow trench isolation (STI) structures, deep trench isolation (DTI) structures or a combination thereof. In these embodiments, a formation method of the isolation structure (e.g., the isolation structure 102 or the additional isolation structure) may include forming a recess on a surface of the substrate 100, and filling an insulating material into the recess. In alternative embodiments, the isolation structures (e.g., the isolation structures 102 and the additional isolation structures) may be local oxidation of silicon (LOCOS) structures.

Prior to the formation of these isolation structures (e.g., the isolation structures 102 and the additional isolation structures), one or more active regions (not shown) may be formed in at least one of the memory region MR, the high voltage region HR and the logic region LR. Adjacent active regions may be substantially isolated from each other by the isolation structure (e.g., the isolation structure 102 or the additional isolation structure) disposed therebetween. Each active region may have a first conductive type or a second conductive type complementary to the first conductive type. For instance, the first conductive type may be N type, whereas the second conductive type may be P type. Furthermore, one or more well regions (not shown) with the first conductive type or the second conductive type may be formed in at least one of the active regions.

Step S104 is formed, and a dielectric layer 104 is formed on the substrate 100. In some embodiments, substantially the whole surface of the substrate 100 is covered by the dielectric layer 104. In other words, the dielectric layer 104 may span in the memory region MR, the logic region LR and the high voltage region HR. In some embodiments, the dielectric layer 104 is formed by a thermal oxidation process. In these embodiments, portions of the isolation structures (e.g., the isolation structures 102) protruding from the surface of the substrate 100 may not be covered by the dielectric layer 104. In alternative embodiments, the dielectric layer 104 may be formed by a deposition process (e.g., a chemical vapour deposition (CVD) process), and the isolation structures (e.g., the isolation structures 102) may be covered by the dielectric layer 104. A material of the dielectric layer 104 may include silicon oxide, silicon nitride, high-k dielectric material (of which a dielectric constant is greater than 4), the like or combinations thereof. In addition, a thickness of the dielectric layer 104 may range from 50 Å to 150 Å.

Figure 2B:
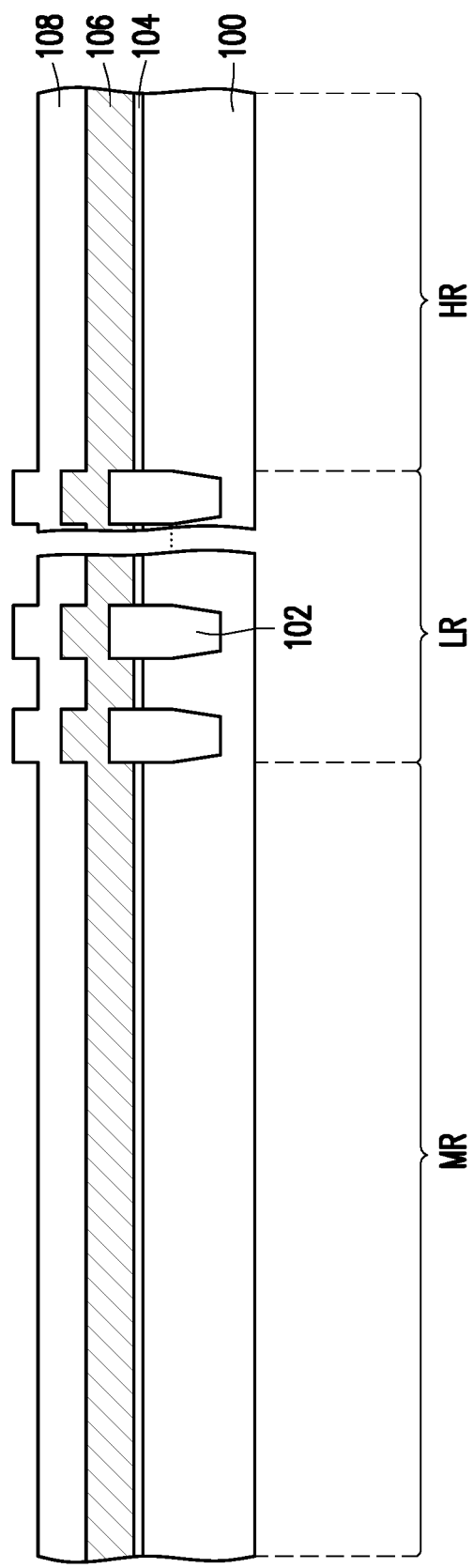

Referring to FIG. 1 and FIG. 2B, step S106 is performed, and a floating gate layer 106 and a hard mask layer 108 are sequentially formed on the substrate 100. In some embodiments, substantially the whole surface of the structure shown in FIG. 2A is covered by the floating gate layer 106 and the hard mask layer 108. In other words, the floating gate layer 106 and the hard mask layer 108 may span in the memory region MR, the logic region LR and the high voltage region HR. In some embodiments, a material of the floating gate layer 106 may include polysilicon, and a material of the hard mask layer 108 may include silicon nitride. A thickness of the floating gate layer 106 may range from 1000 Å to 2000 Å. A thickness of the hard mask layer 108 may range from 1000 Å to 3000 Å. In addition, the floating gate layer 106 and the hard mask layer 108 may be formed by CVD processes.

Figure 2C:
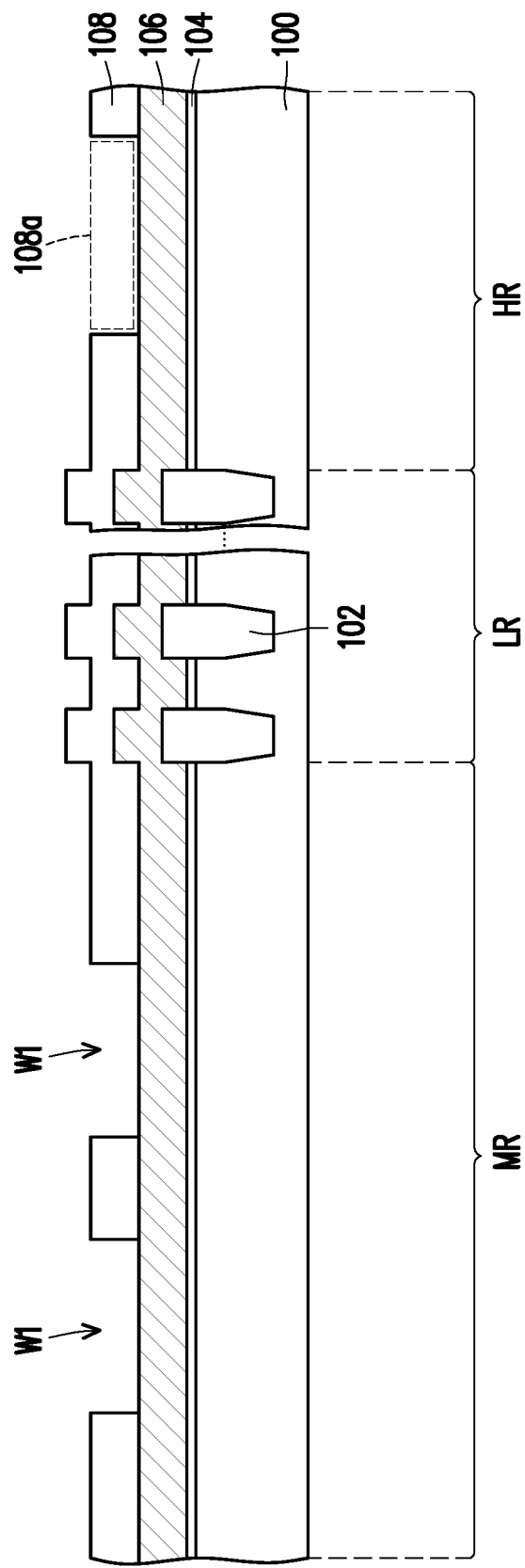

Referring to FIG. 1 and FIG. 2C, step S108 is performed, and the hard mask layer 108 is patterned to form first openings W1. The first opening W1 penetrates through the hard mask layer 108, and exposes portions of the floating gate layer 106 located in the range of the memory region MR. In some embodiments, the first openings W1 may be formed by a lithography process and an etching process. For instance, the etching process may be an anisotropic etching process. In some embodiments, the first openings W1 are spaced apart from one other. Although two first openings W1 are illustrated in FIG. 2C, a single first opening W1 or more than three of the first openings W1 may be formed in the range of the memory region MR. Those skilled in the art may adjust the amount of the first opening(s) W1 according to actual requirements, the present invention is not limited thereto.

Figure 2D:
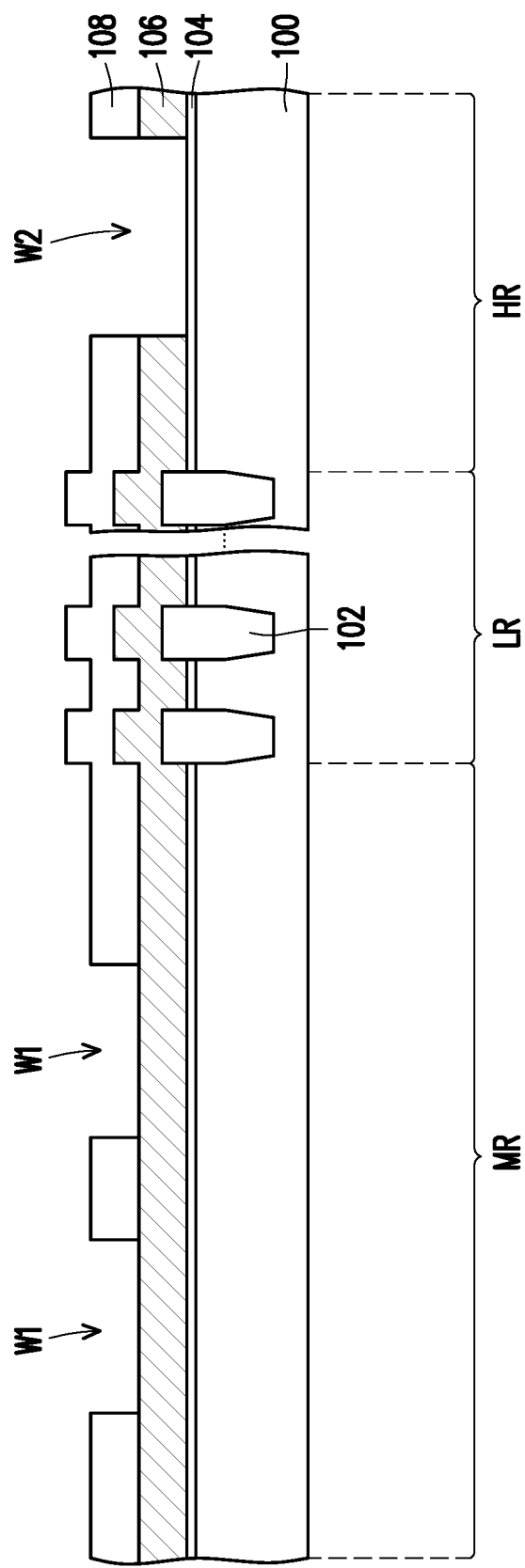

Referring to FIG. 1, FIG. 2C and FIG. 2D, Step S110 is performed, and the hard mask layer 108 and the floating gate layer 106 are patterned to form a second opening W2 (as shown in FIG. 2D). The second opening W2 penetrates through the hard mask layer 108 and the floating gate layer 106, and exposes a portion of the dielectric layer 104 located in the range of the high voltage region HR. In other words, the second opening W2 is overlapped with the high voltage region HR of the substrate 100.

In some embodiments, a formation method of the second opening W2 may include a first sub-step S110a and a second sub-step S110b. As shown in FIG. 2C, the first sub-step S110a is performed, and a portion 108a of the hard mask layer 108 that is overlapped with the high voltage region HR of the substrate 100 is removed. In some embodiments, the step S108 and the first sub-step S110a may be simultaneously performed. In these embodiments, a single lithography process and a single etching process are performed to form the first openings W1, and to remove the portion 108a of the hard mask layer 108. For instance, a photoresist pattern (not shown) having openings defining the locations of the first openings W1 and the to-be removed portion 108a of the hard mask layer 108 may be initially formed on the structure shown in FIG. 2B. Afterwards, an etching process is performed to form the first openings W1, and to remove the portion 108a of the hard mask layer 108 by using the photoresist pattern as a mask. The photoresist pattern may be removed after the first sub-step S110a.

As shown in FIG. 2D, then the second sub-step S110b is performed, and a portion of the floating gate layer 106 is removed to form the second opening W2 by using the patterned hard mask layer 108 as a mask. That is, a sidewall of the second opening W2 is defined by the patterned hard mask layer 108 and the patterned floating gate layer 106, and a portion of the dielectric layer 104 located in the range of the high voltage region HR is exposed by the second opening W2. In some embodiments, the second sub-step S110b is performed by an etching process, such as an anisotropic etching process. In addition, prior to performing the second sub-step S110b, a photoresist pattern (not shown) at least covering the memory region MR is formed on the structure shown in FIG. 2C. As such, the exposed portions of the floating gate layer 106 in the range of the memory region MR can be avoided from being damaged during the second sub-step S110b. The photoresist pattern may be removed after the second sub-step S110b.

Figure 2E:
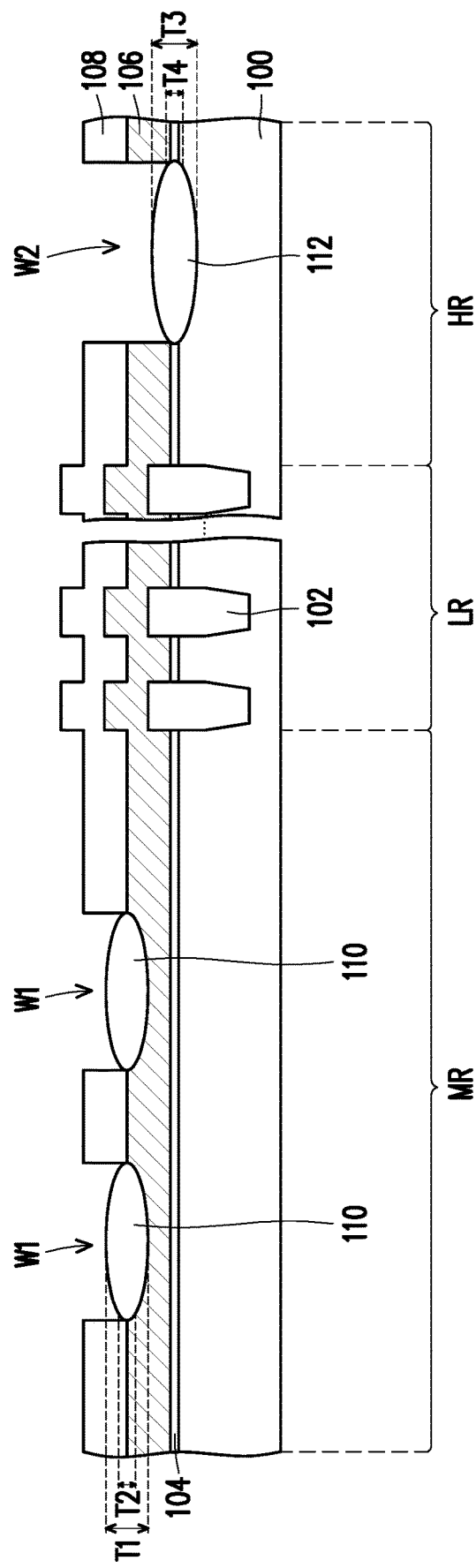

Referring to FIG. 1 and FIG. 2E, step S112 is performed, and a first thermal growth process is performed. As such, first oxide structures 110 are formed on the portions of the floating gate layer 106 exposed by the first openings W1. In the same time, a second oxide structure 112 is formed on the portion of the substrate 100 overlapped with the second opening W2. In some embodiments, the portion of the dielectric layer 104 exposed by the second opening W2 is removed before the first thermal growth process is performed. When the substrate 100 is a silicon wafer and the floating gate layer 106 is made of polysilicon, a material of the first oxide structures 110 and the second oxide structure 112 includes silicon oxide. In some embodiments, thicknesses of the first oxide structures 110 and the second oxide structure 112 respectively range from 1800 Å to 2200 Å. The first oxide structures 110 may be applied in the flash memory devices (e.g., the flash memory devices 10a shown in FIG. 2K) formed in the following steps, and the second oxide structure 112 may be applied in the high voltage transistor (e.g., the high voltage transistor 10b shown in FIG. 2K) formed in the following steps. Those skilled in the art may adjust the thicknesses of the first and second oxide structures 110 and 112 according to actual operation voltages, the present invention is not limited thereto. In some embodiments, a thickness T1 of a central region of the first oxide structure 110 is greater than a thickness T2 of a peripheral region of the first oxide structure 110. Similarly, a thickness T3 of a central region of the second oxide structure 112 may be greater than a thickness T4 of a peripheral region of the second oxide structure 112. In these embodiments, the first oxide structures 110 extend into the underlying portions of the floating gate layer 106, and the second oxide structure 11 extends into the underlying portion of the substrate 100. In other words, some portions of a surface of the floating gate layer 106 are recessed in corresponding to the formation of the first oxide structures 110, and a portion of the substrate 100 is recessed in corresponding to the formation of the second oxide structure 112. In some embodiments, a temperature of the first thermal process does not exceed 1000° C., such as in a range from 900° C. to 1000° C.

Figure 2F:
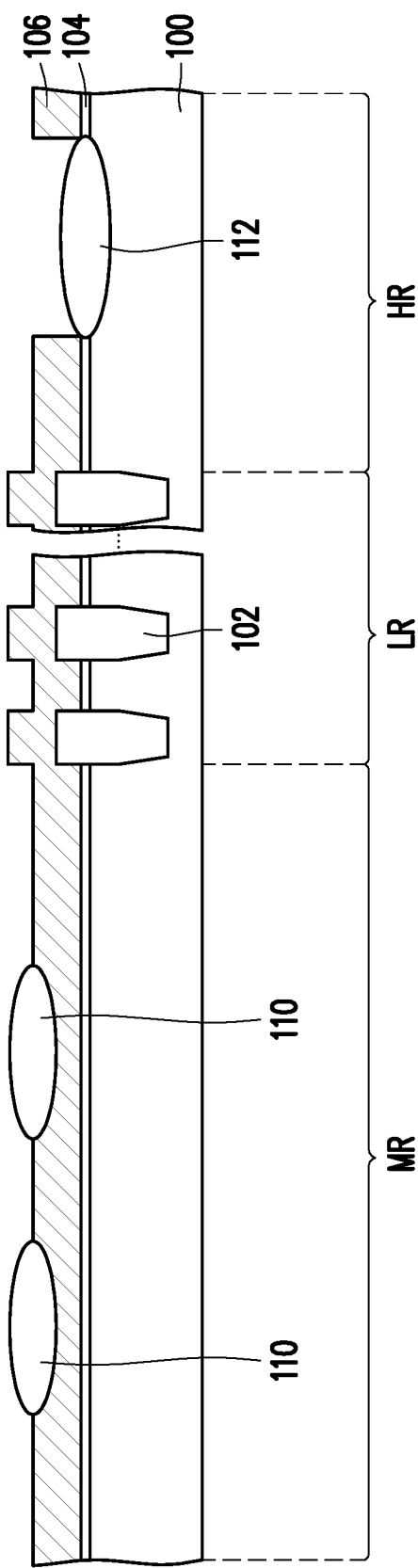

Referring to FIG. 1 and FIG. 2F, step S114 is performed, and the hard mask layer 108 is removed. In some embodiments, the hard mask layer 108 is removed by an isotropic etching process, such as a wet etching process. In certain embodiments, the first oxide structures 110 and the second oxide structure 112 may be partially removed during the wet etching process. When the hard mask layer 108 is made of silicon nitride and the material of the second oxide structure 112 is silicon oxide, the wet etching process is performed by using hot phosphoric acid. Giving an etching rate difference between silicon nitride and silicon oxide with respect to phosphoric acid, only insignificant portions of the first oxide structures 110 and the second oxide structure 112 may be removed. For instance, a thickness reduction of the first oxide structures 110 and the second oxide structure 112 during the step S114 is less than 5 Å, such as in a range from 1 Å to 2 Å.

Figure 2G:
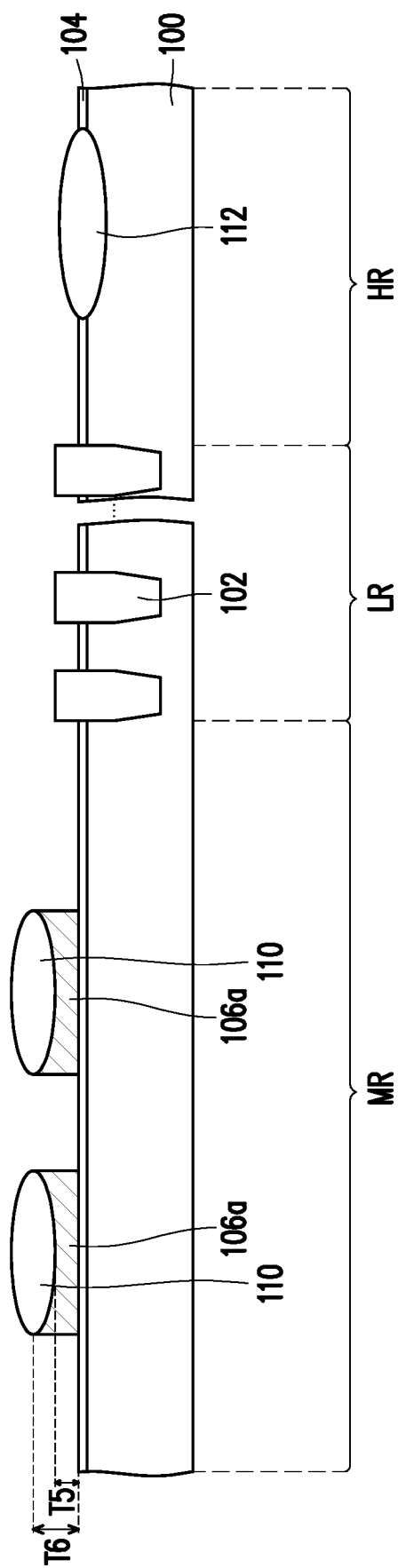

Referring to FIG. 1 and FIG. 2G, step S116 is performed, and the floating gate layer 106 is patterned by using the first oxide structures 110 as masks. In some embodiments, the patterning process performed on the floating gate layer 106 in the step S116 is a self-align patterning process. The remained portions of the floating gate layer 106 are respectively located between the dielectric layer 104 and the first oxide structures 110, and sidewalls of the remained portions of the floating gate layer 106 may be coplanar with the sidewalls of the first oxide structures 110. The remained portions of the floating gate layer 106 are also referred as floating gate structures 106a in the present disclosure. On the other hand, other portions of the floating gate layer 106 are removed. In the embodiments that the first oxide structures 110 extend into the underlying portions of the floating gate layer 106, such that the formed floating gate structures 106a have recessed top surfaces. In these embodiments, a thickness T5 of a central region of the floating gate structure 106a is less than a thickness T6 of a peripheral region of the floating gate structure 106a.

Figure 2H:
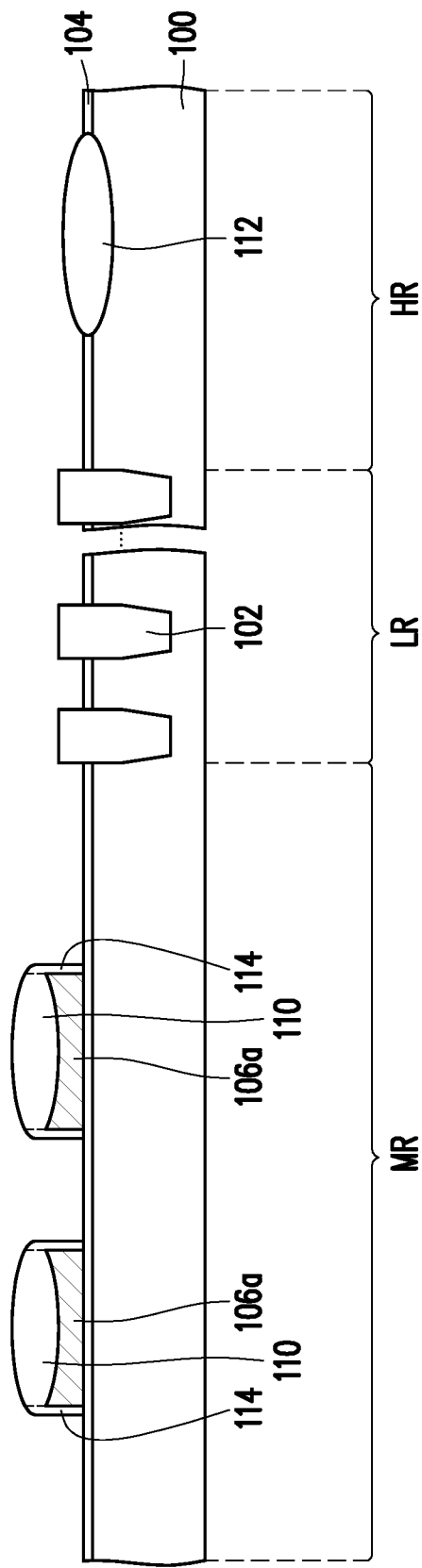

Referring to FIG. 1 and FIG. 2H, in some embodiments, step S118 is performed, and inter-gate dielectric layers 114 are formed on the sidewalls of the floating gate structures 106a. In some embodiments, the inter-gate dielectric layers 114 are formed by a second thermal growth process. In these embodiments, oxide materials may not formed on the existing oxide structures (e.g., the isolation structures 102, the dielectric layer 104, the first oxide structures 110 and the second oxide structure 112), but formed on the exposed surface of the floating gate structures 106a. In some embodiments, the inter-gate dielectric layers 114 may further extend onto the sidewalls of the first oxide structures 110. In some embodiments, the floating gate structures 106a are made of polysilicon, and a material of the inter-gate dielectric layers 114 includes silicon oxide. In addition, a temperature of the second thermal growth process does not exceed 1000° C., such as in a range from 900° C. to 1000° C.

Figure 2I:
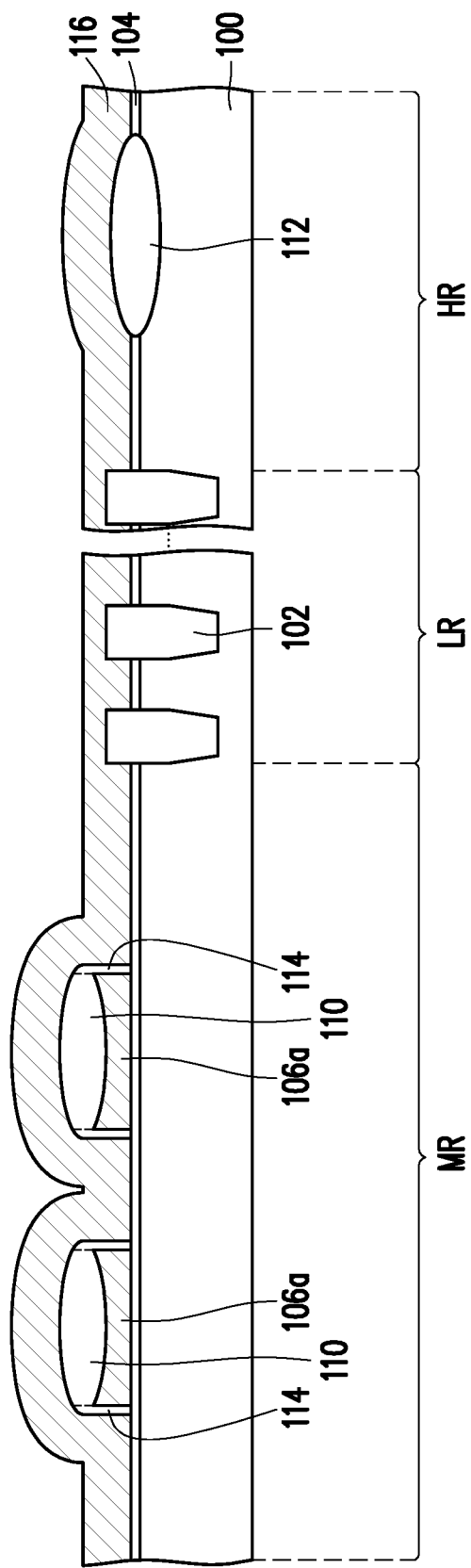

Referring to FIG. 1 and FIG. 2I, step S120 is performed, and a gate layer 116 is formed over the substrate 100. In some embodiments, substantially the whole surface of the structure shown in FIG. 2H is covered by the gate layer 116. A material of the gate layer 116 may include polysilicon, tungsten, the like or combinations thereof. A thickness of the gate layer 116 may range from 1000 Å to 2000 Å. In addition, a formation method of the gate layer 116 may include a CVD process.

Figure 2J:
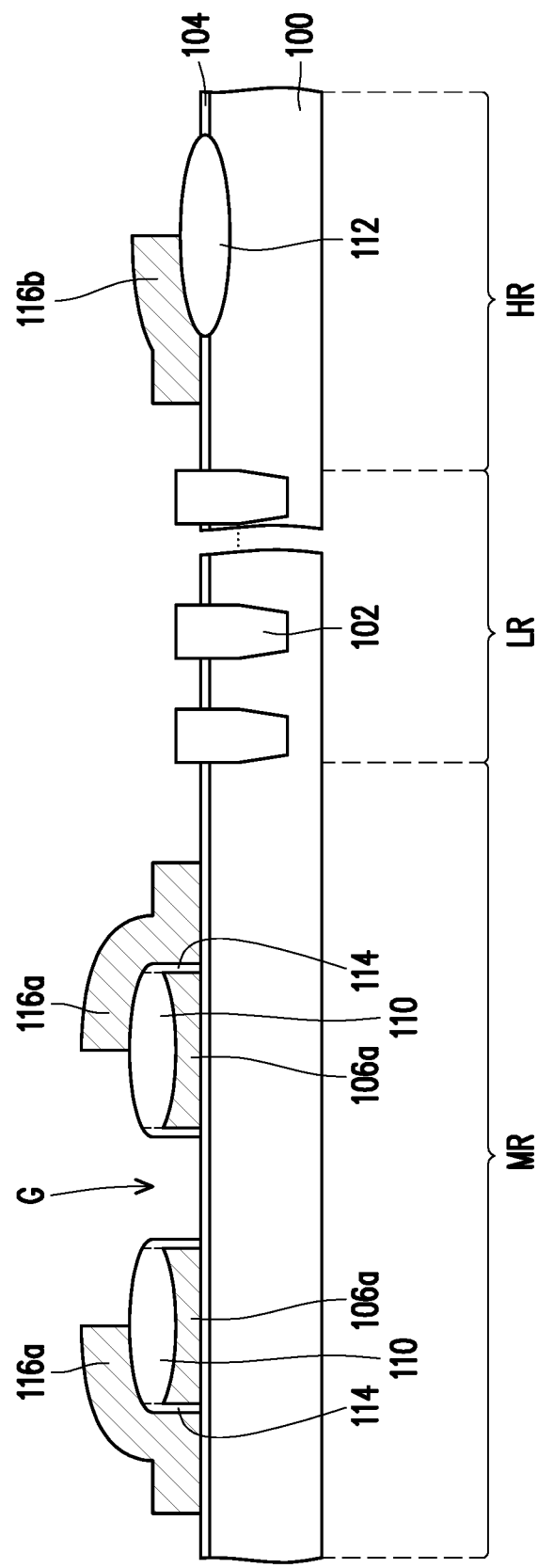

Referring to FIG. 1 and FIG. 2J, step S122 is performed, and the gate layer 116 is patterned to form control gate structures 116a and a gate structure 116b. That is, some portions of the gate layer 116 are removed, and remained portions of the gate layer 116 include the control gate structures 116a and the gate structure 116b. The control gate structures 116a are located over the substrate 100 and in the range of the memory region MR. In addition, the control gate structures 116a respectively extend onto top surfaces of the first oxide structures 110 along surfaces of the inter-gate dielectric layers 114. The top surface of each first oxide structure 110 are at least partly covered by one of the control gate structures 116a, as well as the surface of each inter-gate dielectric layer 114. In some embodiments, the control gate structures 116a extend onto the first oxide structures 110 from opposite sides of the first oxide structures 110. In these embodiments, the control gate structures 116a are opposite to each other with respect to a gap G between adjacent first oxide structures 110. On the other hand, the gate structure 116b is located over the substrate 100 and in the range of the high voltage region HR. In addition, the gate structure 116b extends onto a top surface of the second oxide structure 112 from a side of the second oxide structure 112.

Referring to FIG. 1 and FIG. 2K, step S124 is performed, and first doped regions 118, a second doped region 120, a third doped region 122 and a fourth doped region 124 are formed in the substrate 100. The first doped regions 118 and the second doped region 120 are formed in the memory region MR, and the second doped region 120 is located between the first doped regions 118. The second doped region 120 is overlapped with the gap G, which is located between adjacent first oxide structures 110. In addition, each first doped region 118 is located at a side of one of the control gate structures 116a that is opposite to the second doped region 120. On the other hand, the third doped regions 122 and the fourth doped region 124 are formed in the high voltage region HR. The gate structure 116b and the second oxide structure 112 are located between the third doped region 122 and the fourth doped region 124. In some embodiments, the first doped regions 118, the second doped region 120, the third doped region 122 and the fourth doped region 124 are formed by, for example, one or more ion implantation processes. In these embodiments, the first oxide structures 110, the inter-gate dielectric layer 114 and the control gate structures 116a may be functioned as masks during the formation of the first doped regions 118 and the second doped region 120. In addition, the second oxide structure 112 and the gate structure 116b are functioned as masks during the formation of the third doped region 122 and the fourth doped region 124. In some embodiments, the first doped regions 118 and the second doped region 120 have the same conductive type (e.g., N type or P type), and the third doped region 122 and the fourth doped region 124 have the same conductive type (e.g., N type or P type).

Up to here, a semiconductor device 10 is formed. The semiconductor device 10 includes flash memory devices 10a, which are formed in the range of the memory region MR. The flash memory devices 10a may be split gate flash memory devices. Each of the flash memory devices 10a includes a pair of the first doped region 118 and the second doped region 120, and includes the components located between the pair of first doped region 118 and second doped region 120. The components between the pair of first doped region 118 and second doped region 120 includes a portion of the substrate 100, a portion of the dielectric layer 104, one of the floating gate structures 106a, one of the first oxide structures 110, one of the inter-gate dielectric layer 114 and one of the control gate structure 116a. In some embodiments, the flash memory devices 10a share the same second doped region 120. Although two flash memory devices 10a are shown in FIG. 2K, those skilled in the art may adjust the amount of the flash memory device(s) 10a according to design requirements, the present invention is not limited thereto.

Moreover, the semiconductor device 10 further includes a high voltage transistor 10b, which is formed in the range of the high voltage region HR. The high voltage transistor 10b may be a laterally diffused metal-oxide-semiconductor (LD-MOS) device. The high voltage transistor 10b includes the third doped region 122, the fourth doped region 124 and the components located between the third doped region 122 and the fourth doped region 124. The components located between the third doped region 122 and the fourth doped region 124 includes a portion of the substrate 100, a portion of the dielectric layer 104, the second oxide structure 112 and the gate structure 116b. Although a single high voltage transistor 10b is shown in FIG. 2K, those skilled in the art may adjust the amount of the high voltage transistor(s) 10b according to design requirements, the present invention is not limited thereto.

In some embodiments, during step S100 through step S124, logic devices 10c may be formed in and over the substrate 100 within the range of the logic region LR. In addition, at least one of the logic devices 10c is located between adjacent isolation structures 102. In some embodiments, the logic devices 10c include active devices, and may further include passive device(s). For instance, the active devices may include a field effect transistor, a bipolar junction transistor (BJT), the like or combinations thereof. The passive device(s) may include a resistor, a capacitor, an inductor, the like or combinations thereof.

As above, the flash memory devices 10a, the high voltage transistor 10b and the logic devices 10c are integrally formed in the semiconductor device 10. As compared to a conventional manufacturing method that forms oxide structures for different applications at different stages, the first oxide structures 110 for the flash memory devices 10a and the second oxide structure 112 for the high voltage transistor 10b are simultaneously formed in the manufacturing process of the semiconductor device 10 in the present invention. As such, the manufacturing method is simplified, and the manufacturing cost is lowered.

In addition, during the conventional manufacturing method, a pad oxide layer is typically formed prior to the formation of the oxide structures, and this pad oxide layer is required to be removed after some of the oxide structures are formed. As a result, the formed oxide structures may subject to damages during the removal of the pad oxide layer. On the other hand, according to the embodiments of the present invention, the initially formed dielectric layer 104 is remained in the final structure of the semiconductor device 10 as the tunnel oxide layer of the flash memory device 10a and the gate dielectric layer of the high voltage transistor 10b. Formation and removal of a pad oxide layer are absent in the manufacturing method of the semiconductor device 10 in the present application. Accordingly, damages on the oxide structures (e.g., the first oxide structures 110 and the second oxide structure 112) can be effectively reduced. Therefore, reliability of the semiconductor device 10 is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a semiconductor device, comprising:
    providing a substrate having a memory region and a high voltage region;
    sequentially forming a floating gate layer and a hard mask layer on the substrate, wherein the floating gate layer and the hard mask layer span in the ranges of the memory region and the high voltage region;
    patterning the hard mask layer to form a first opening exposing a portion of the floating gate layer located in the range of the memory region;
    patterning the hard mask layer and the floating gate layer to form a second opening overlapped with the high voltage region;
    performing a first thermal growth process to simultaneously form a first oxide structure on the portion of the floating gate layer exposed by the first opening, and to form a second oxide structure on a portion of the substrate overlapped with the second opening;
    removing the hard mask layer; and
    patterning the floating gate layer by using the first oxide structure as a mask, to form a floating gate structure in the range of the memory region.

2. The manufacturing method of the semiconductor device of claim 1, wherein the step of forming the second opening comprises:
    removing a portion of the hard mask layer that is overlapped with the high voltage region of the substrate; and
    removing a portion of the floating gate layer to form the second opening by using the patterned hard mask layer as a mask.

3. The manufacturing method of the semiconductor device of claim 2, wherein the step of forming the first opening and the step of removing the portion of the hard mask layer that is overlapped with the high voltage region of the substrate are performed at the same time.

4. The manufacturing method of the semiconductor device of claim 1, wherein a temperature of the first thermal process ranges from 900° C. to 1000° C.

5. The manufacturing method of the semiconductor device of claim 1, further comprising:
    forming a dielectric layer on the substrate before forming the floating gate layer and the hard mask layer.

6. The manufacturing method of the semiconductor device of claim 5, wherein the floating gate structure is located on the dielectric layer.

7. The manufacturing method of the semiconductor device of claim 1, further comprising:
    forming an inter-gate dielectric layer on a sidewall of the floating gate structure; and
    forming a control gate structure over the substrate within the range of the memory region to cover a surface of the inter-gate dielectric layer, wherein the control gate structure further extends onto the first oxide structure.

8. The manufacturing method of the semiconductor device of claim 7, wherein the inter-gate dielectric layer is formed by a second thermal growth process.

9. The manufacturing method of the semiconductor device of claim 8, wherein a temperature of the second thermal growth process ranges from 900° C. to 1000° C.

10. The manufacturing method of the semiconductor device of claim 7, further comprising:
    forming a first doped region and a second doped region in the memory region of the substrate, wherein the control gate structure, the first oxide structure, the inter-gate dielectric layer and the floating gate structure are located between the first doped region and the second doped region.

11. The manufacturing method of the semiconductor device of claim 1, further comprising:
    forming a gate structure over the substrate within the range of the high voltage region, wherein the gate structure extends onto the second oxide structure.

12. The manufacturing method of the semiconductor device of claim 11, further comprising:
    forming a third doped region and a fourth doped region in the high voltage region of the substrate, wherein the gate structure and the second oxide structure are located between the third doped region and the fourth doped region.

13. The manufacturing method of the semiconductor device of claim 1,
    wherein a thickness of a central region of the first oxide structure is greater than a thickness of a peripheral region of the first oxide structure, and
    wherein a thickness of a central region of the second oxide structure is greater than a thickness of a peripheral region of the second oxide structure.

14. The manufacturing method of the semiconductor device of claim 1, wherein a thickness of a central region of the floating gate structure is less than a thickness of a peripheral region of the floating gate structure.

15. The manufacturing method of the semiconductor device of claim 1, wherein the substrate further has a logic region, and the logic region is located between the memory region and the high voltage region.

16. The manufacturing method of the semiconductor device of claim 15, wherein a plurality of isolation structures and at least one logic device are formed in and over the substrate within the range of the logic region, and the at least one logic device is located between adjacent isolation structures.

* * * * *